United States Patent [19]

Fujiie

[11] Patent Number: 4,491,882
[45] Date of Patent: Jan. 1, 1985

[54] DISC PLAYERS

[75] Inventor: Kazuhiko Fujiie, Tokyo, Japan

[73] Assignee: Sony Corporation, Tokyo, Japan

[21] Appl. No.: 440,032

[22] Filed: Nov. 8, 1982

[30] Foreign Application Priority Data

Nov. 14, 1981 [JP]  Japan .................................. 56-182700

[51] Int. Cl.³ .............................................. G11B 5/09
[52] U.S. Cl. ..................................................... 360/53
[58] Field of Search ............................. 360/53, 32, 39

[56] References Cited

U.S. PATENT DOCUMENTS 4,345,280  8/1982  Blagaila et al. ......................... 360/53
4,403,263  9/1983  Kageyama et al. ..................... 360/53

Primary Examiner—Vincent P. Canney
Attorney, Agent, or Firm—Hill, Van Santen, Steadman & Simpson

[57] ABSTRACT

A disc player for reproducing an information signal from a disc having an information track on which the information signal is recorded in the form of digital data, such as a digital audio disc, is provided with an improved error correcting circuit arrangement of correcting errors in reproduced digital data obtained from the disc, wherein the error correcting ability for errors in the reproduced digital data obtained in the cue reproducing state or review reproducing state is reduced in comparison with the error correcting ability for errors in the reproduces digital data obtained in the normal reproducing state, so that erroneous error correction in the cue reproducing state or review reproducing state is reduced and therefore click noise components are prevented from being contained in a reproduced information signal.

4 Claims, 4 Drawing Figures

DISC PLAYERS

BACKGROUND OF THE INVENTION

This invention relates generally to apparatus for reproducing an information signal from a rotatable disc-shaped record medium on which the information signal is recorded in the form of digital data, such as a digital audio disc, and more particularly to disc players for a disc having digital data recorded thereon wherein the error correcting ability for errors in reproduced digital data in the reproducing state by fast forwarding operation (the cue reproducing state) or in the reproducing state by fast reversing operation (the review reproducing state) is reduced in comparison with the error correcting ability exhibited in the normal reproducing state so as to reduce erroneous error correction in the cue reproducing state or the review reproducing state.

In a digital audio disc system a rotatable disc-shaped record medium having an information track on which various digital data including audio signal data, synchronous data, address data, data for error correction and so on are recorded is provided as a digital audio disc and such a digital audio disc is applied to a disc player for reproducing an audio signal in accordance with the digital data recorded on the digital audio disc. With such a system a reproduced audio signal of high quality can be obtained easily. However, in reproduction of the audio signal from the digital audio disc by the disc player, in case that errors are caused in reproduced digital data obtained from the information track of the digital audio disc, relatively large click niose components are contained in the reproduced audio signal so as to deteriorate the quality of the latter.

In this connection, generally, digital data recorded on a digital audio disc contain almost unavoidably coding errors caused in the recording process though they appear at low probability and therefore the errors caused due to such coding errors would be contained in reproduced digital data obtained from the digital audio disc. Further, fingerprints and scratches on the surface of the digital audio disc would induce errors of relatively large scale in the reproduced digital data.

Accordingly, in the digital audio disc system a method of error correction using a so-called cross-interleave technique is taken to correct the errors induced in the reproduced digital data obtained from the digital audio disc. In such cross-interleave technique, a first error correcting code for a first arrangement stage and a second error correcting code for a second arrangement stage are provided and an interleave is carried out between the first and second arrangement stages. Further, Reed-Solomon Code is adopted for both the first and second error correcting codes. Such a combination of Reed-Solomon Code and the interleave technique provides a significant advance in error correcting ability for errors in the reproduced digital data. The disc player in the system is provided with such an error correcting circuit arrangement as to perform the error correction for the reproduced digital data, which are obtained from the digital audio disc and contain the first and second error correcting codes added in accordance with the cross-interleave technique, with use of the first error correcting code contained in the reproduced digital data at the first arrangement stage and further with use of the second error correcting code also contained in the reproduced digital data at the second arrangement stage.

However, with the aforementioned error correcting circuit arrangement provided in previously proposed disc players, although appropriate error correction is achieved when the disc player is in the normal reproducing state wherein the reproducing digital data are obtained continuously from the digital audio disc, erroneous error correction would be increased when the disc player is in the cue reproducing state or review reproducing state because the reproduced digital data are obtained intermittently from the digital audio disc in the cue reproducing state or review reproducing state. That is, in the cue reproducing state or review reproducing state, a pickup device which is provided in the disc prayer for reading out the digital data recorded on the digital audio disc is controlled to conduct a track jump operation to traverse hundreds of circles of the information track quickly without reading out the digital data and to trace a portion of one circle of the information track for reading out the digital data recorded thereon, alternately. This results in that the lack of the reproduced digital data is caused whenever the pickup device conducts the track jump operation. Consequently, in case that, in the cue reproducing state or review reproducing state, error correction is performed in the same manner as the error corection in the normal reproducing state, erroneous error correction is caused due to such lack of the reproduced digital data at relatively high propability and, as a result of this, click noise components are contained in a reproduced audio signal. Although the reproduced audio signal obtained in the cue reproducing state or review reproducing state is not required to have such high quality as required to the reproducing audio signal obtained in the normal reproducing state, the click noise component in the reproducing audio signal obtained in the cue reproducing state or review reproducing state also produces a harsh click sound and therefore is desired to be eliminated.

To avoid such erroneous error correction as to cause the click noise components in the reproduced audio signal, it is considered to control the error correcting circuit arrangement not to perform any error correction in the cue reproducing state and review reproducing state. However, such a proposal is not desirable because even obvious errors contained in the reproduced digital data are not corrected and relatively large click noise components are induced in the reproduced audio signal thereby.

OBJECTS AND SUMMARY OF THE INVENTION

Accordingly, it is an object of the present invention to provide a disc player for reproducing an information signal from a disc having an information track on which the information signal is recorded in the form of digital data with an improved error correcting circuit arrangement which aviods the above described disadvantages of the prior art.

Another object of the present invention is to provide a disc player for reproducing an information signal from a disc having an information track on which the information signal is recorded in the form of digital data with an improved error correcting circuit arrangement which performs error correction for reproduced digital data obtained from the disc and containing error correcting codes added in accordance with the cross-interleave technique in the respective different modes in the normal reproducing state and in the cue reproducing state or review reproducing state, respectively, so that erroneous error correction in the cue reproducing state or review reproducing state is reduced.

A further object of the present invention is to provide a disc player for reproducing an information signal from a disc having an information track on which the information signal is recorded in the form of digital data with an improved error correcting circuit arrangement wherein the error correcting ability for errors in reproduced digital data obtained from the disc can be varied in accordance with a reproducing manner taken by the disc player.

According to an aspect of the present invention, a disc player for reproducing an information signal from a disc having an information track on which the information signal is recorded in the form of digital data is provided with an improved error correcting circuit arrangement for correcting errors in reproduced digital data obtained from the disc, wherein the error correcting ability for errors in the reproduced digital data obtained in the cue reproducing state or review reproducing state is reduced in comparison with the error correcting ability for errors in the reproduced digital data obtained in the normal reproducing state, so that erroneous error correction in the cue reproducing state or review reproducing state is reduced. With such reduction of the erroneous error corection, a reproduced information signal obtained in the cue reproducing state or review reproducing state is prevented from containing click noise components therein.

The above, and other objects, features and advantages of the present invention will become apparent from the following detailed description of a preferred embodiment taken in conjunction with the accompanying drawings.

DESCRIPTION OF THE PREFERRED EMBODIMENT

Figure 1:
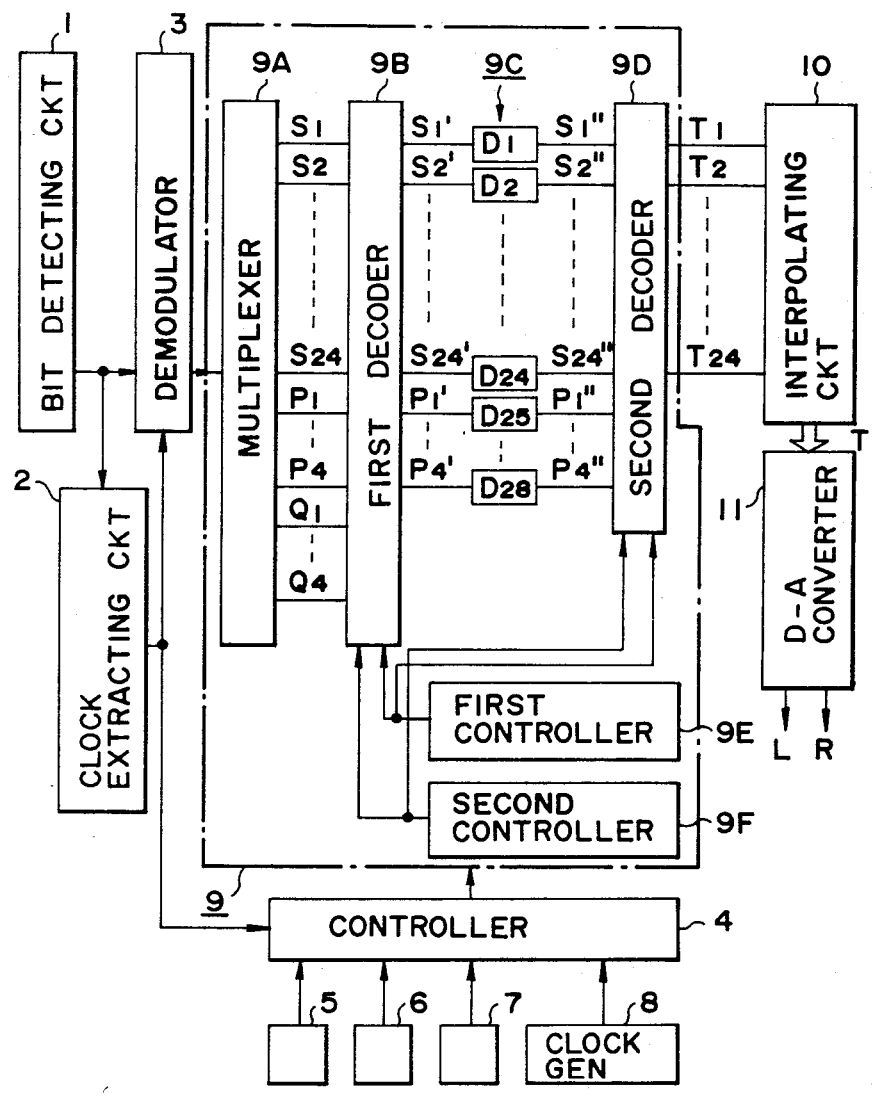
FIG. 1 is a block diagram showing an essential part of one embodiment of a disc player according to the present invention.

An essential part of one example of a disc player according to the present invention is shown in FIG. 1. In this example, at the output end of a pickup device (not shown in FIG.) provided for reading out a signal from a digital audio disc having a spiral track on which an audio signal is recorded in the form of digital data processed in accordance with the cross-interleave technique, a bit detecting circuit 1 is provided to be supplied with the signal read out from the digital audio disc by the pickup device. The bit detecting circuit 1 produces a reproduced digital signal having an appropriate waveform in response to the signal supplied thereto from the pickup device. The reproduced digital signal is supplied to a clock extracting circuit 2 and a clock signal for reproducing is derived from the output end of the clock extracting circuit 2 to be supplied to a demodulator 3 and a controller 4, respectively. The reproduced digital signal is also supplied to the demodulator 3 from the bit detecting circuit 1. At the demodulator 3, the reproduced digital signal is demodulated with the clock signal from the clock extracting circuit 2 to produce reproduced digital data which, for example, are formed into a sequence of frame units each of which contains in series, for example, twenty-four audio signal data words of eight bits each and four first error correcting words of eight bits each and four second error correcting words of eight bits each and the reproduced digital data obtained at the demodulator 3 are supplied to a decoding circuit arrangement 9. The controller 4 is supplied with various control signals other than clock signal from the clock extracting circuit 2, such as a control signal for the operation in the cue reproducing state from a key 5 for cue reproducing, a control signal for the operation in the review reproducing state from a key 6 for review reproducing, a control signal for the operation in the normal reproducing state from a key 7 for normal reproducing and a control signal from a clock generating circuit 8, and controls the decoding circuit block 9 in accordance with the control signals supplied thereto.

Now, the decoding circuit block 9 will be explained in detail hereinafter. The decoding circuit block 9 comprises a multiplexer 9A, a first decoder 9B, a de-interleaver 9C which has a plurality of delay lines $D_1$ to $D_{28}$, a second decoder 9D, a first controller 9E and a second controller 9F.

When the reproduced digital data from the demodulator 3 are supplied to the multiplexer 9A, the data of altogether thirty-two words including twenty-four audio signal data words $S_1$ to $S_{24}$, four first error correcting words $P_1$ to $P_4$ and four second error correcting words $Q_1$ to $Q_4$ in each frame unit forming the reproduced digital data appear at the output end of the multiplexer 9A as parallel output data. These thirty-two words are supplied to the first decoder 9B. In the first decoder 9B, the first error correction for the data including the twenty-four audio signal data words $S_1$ to $S_{24}$ and the four first error correcting words $P_1$ to $P_4$ is carried out by using the four second error correcting words $Q_1$ to $Q_4$, and the first decoder 9B derives the data including twenty-four audio signal data words $S_1'$ to $S_{24}'$ and four first correcting words $P_1'$ to $P_4'$ all having been subjected to the first error correction. At every individual word of the data of these twenty-eight words, a pointer, i.e. an additional bit is added to indicate whether there is an error in the associated word or not.

The output data from the first decoder 9B are applied to the de-interleaver 9C which has the delay lines $D_1$ to $D_{28}$ with respective different delay amounts provided for twenty-eight transmission channels through which the twenty-eight words from the first decoder 9B are transmitted, respectively. With these delay lines $D_1$ to $D_{28}$ the twenty-eight words from the first devoder 9B are delayed for de-interleaving and de-interleaved twenty-four audio signal data words $S_1''$ to $S_{24}''$ and four first error correcting words $P_1''$ to $P_4''$ are derived from the de-interleaver 9C. The output data from the de-interleaver 9C are applied to the second decoder 9D. In the second decoder 9D, the second error correction for the data of the twenty-four audio signal data words $S_1''$ to $S_{24}''$ is carried out by using the four first error correcting words $P_1''$ to $P_4''$, and the second decoder 9D derives the data of twenty-four audio signal data words $T_1$ to $T_{24}$ having been subjected to the second error correction. At every individual word of the data of these twenty-four words also, the pointer is added to indicate whether there is an error in the assosiated word or not.

The first controller 9E receives a control signal which is produced by the controller 4 when the key 7 for normal reproducing is manipulated so that the disc player takes the normal reproducing state and controls, in response to the control signal, the first and second decoders 9B and 9D to have such error correcting ability as to be able to correct, for example, one word error and two word errors. Further, the second controller 9F receives another control signal which is produced by the controller 4 when the key 5 for cue reproducing or the key 6 for review reproducing is manipulated so that the disc player takes the cue reproducing state or the review reproducing state and controls, in response to the another control signal, the first and second decoders 9B and 9D to have such error correcting ability reduced in comparison with the error correcting ability in the normal reproducing state as to be able to correct, for example, only one word error.

As described above, an error correcting circuit arrangement is formed in the decoding circuit block 9 and an interpolating circuit 10 is connected to the output end thereof. The interpolating circuit 10 is supplied with the output data from the decoding circuit block 9, that is, the twenty-four audio signal data words $T_1$ to $T_{24}$ and a further correction by interpolation for selected ones having the pointer added thereto of the twenty-four audio signal data words $T_1$ to $T_{24}$ is carried out in the interpolating circuit 10.

The output T of the interpolating circuit 10 is applied to a digital to analog converter 11. The digital to analog converter 11 converts the output T from the interpolating circuit 10 into a couple of analog signals corresponding to right channel data and left channel data both contained in the output T, respectively, and derives them therefrom as reproduced right and left channel audio signals R and L.

Then, the more detailed error correcting operation of the error correcting circuit arrangement formed in the decoding circuit block 9 will be explained with reference to the chart of FIG. 2, wherein Y represents "yes" and N represents "no".

Figure 2A:
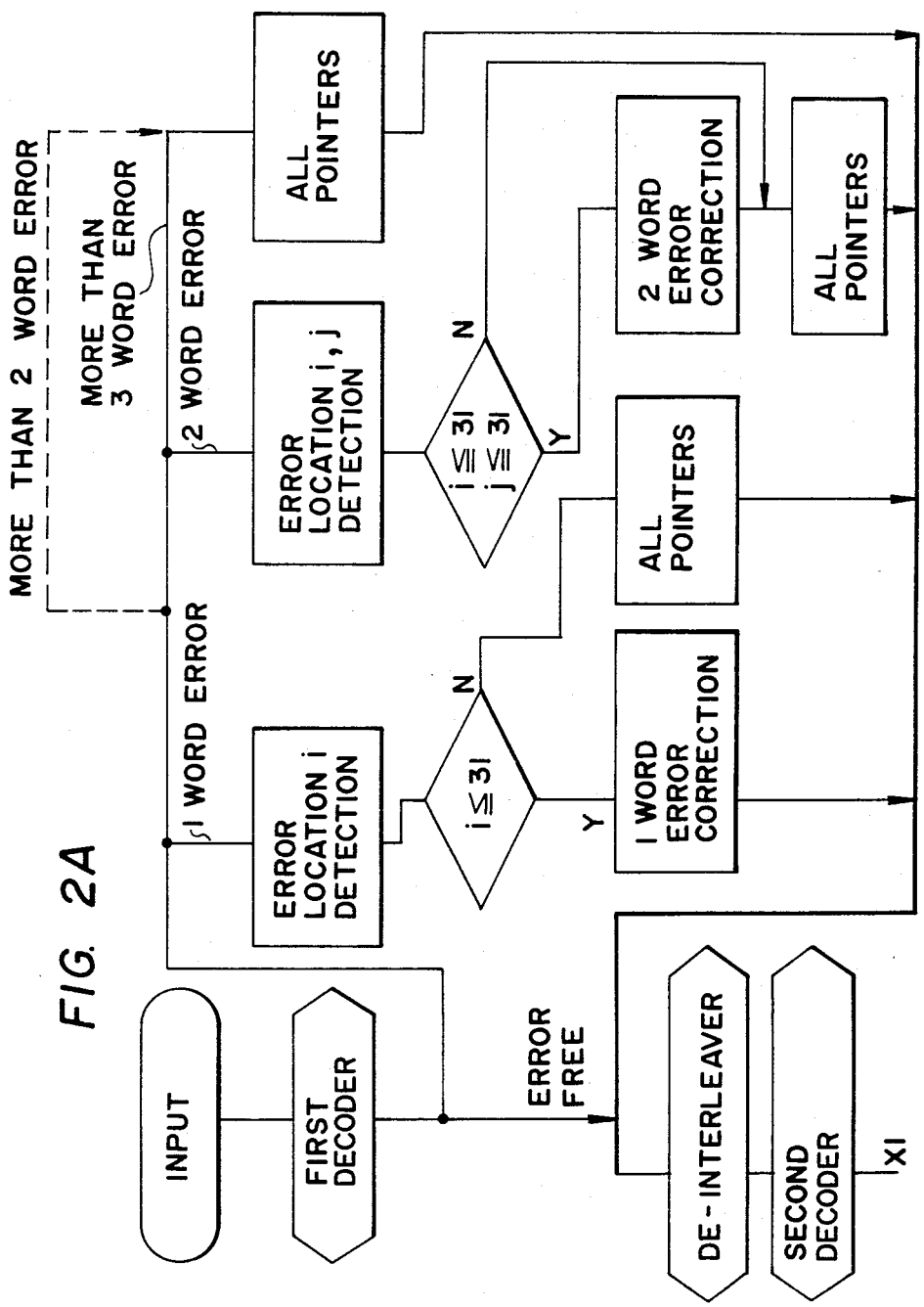
FIG. 2 (formed of FIGS. 2A, 2B and 2C together) is a diagram used for explaining the operation of error correction in the embodiment shown in FIG. 1.
Figure 2B:
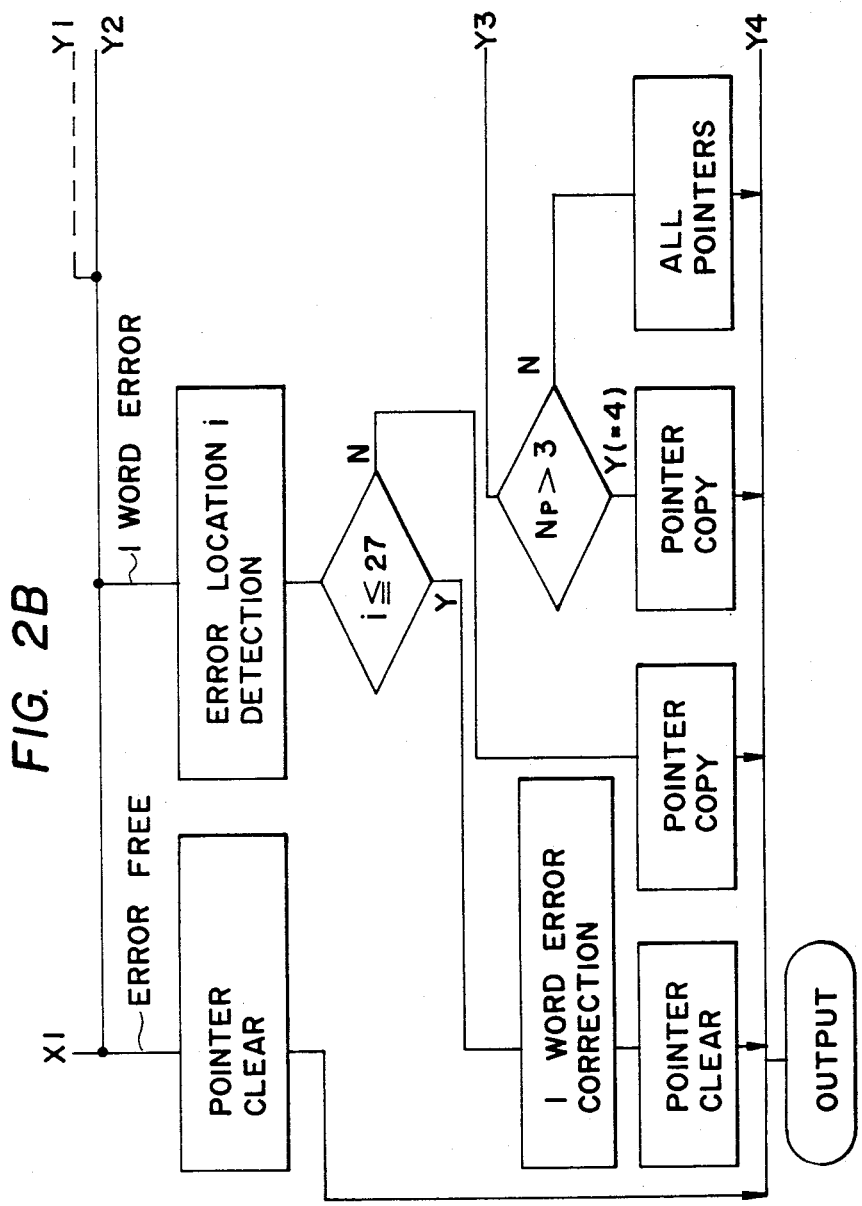
Figure 2C:
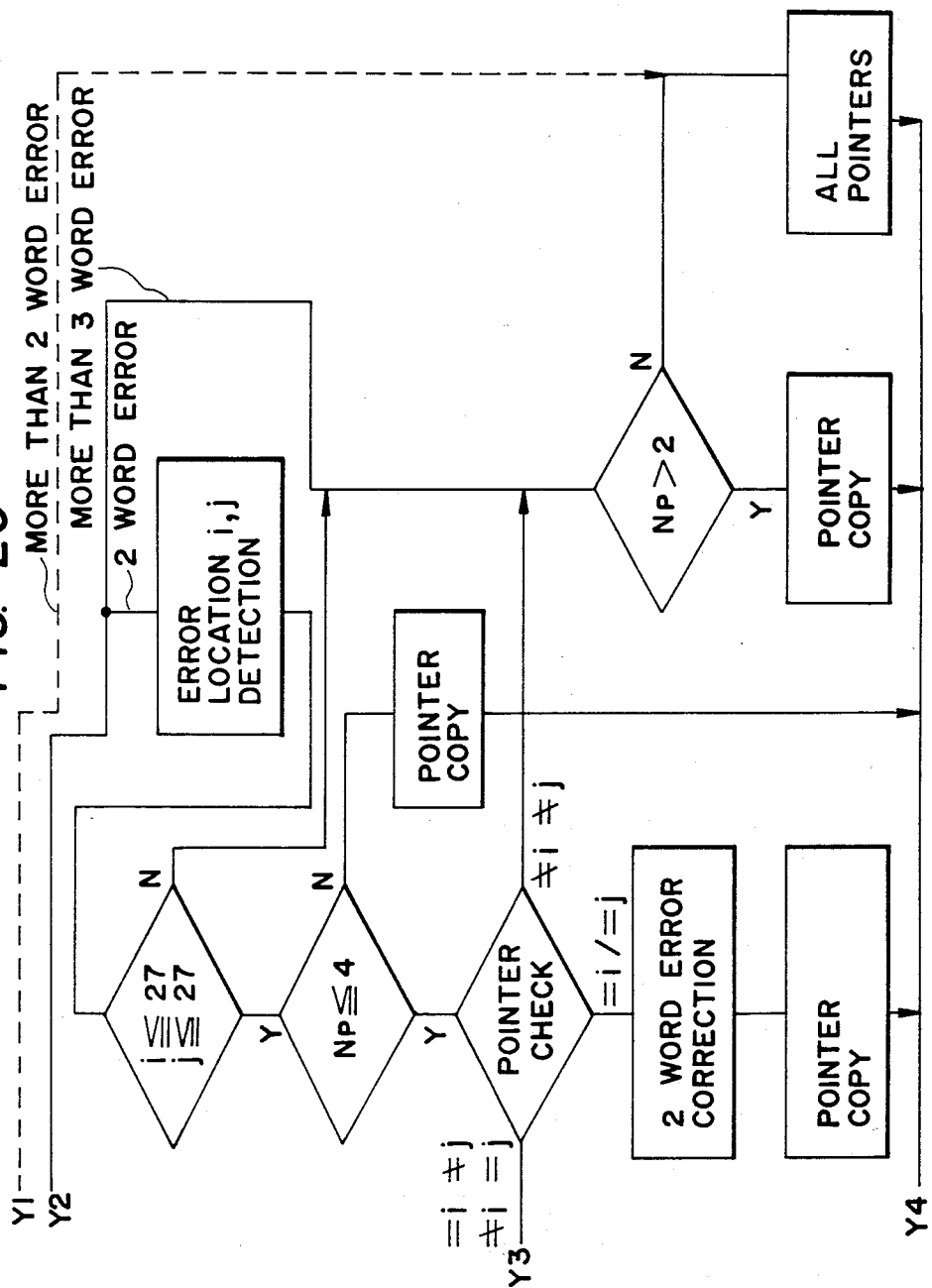

First, in the case of the normal reproducing state, the first controller 9E is supplied with the control signal produced in response to the manipulation of the key 7 from the controller 4 and operates to control the first and second decoders 9B and 9D to exhibit their error correcting ability at the maximum, and the error correcting operation having its flow shown by solid lines in FIG. 2 is carried out.

When the data of the thirty-two words including the twenty-four audio signal data words $S_1$ to $S_{24}$, the four first error correcting words $P_1$ to $P_4$ and the four second error correcting words $Q_1$ to $Q_4$ are applied to the first decoder 9B, the following operations are performed:

(A) In the case of no error, no pointer is added and the data are unchanged.

(B) In the case of one word error, the error location i is detected in order to judge whether the one word is to be cerrected or not. It is checked whether $i \leq 31$ is satisfied or not. If $i \leq 31$ is satisfied, the one word is corrected. On the contrary, if $i \leq 31$ is not satisfied, pointers are added to all words.

(C) In the case of two word errors, the error locations i and j are detected in order to judge whether the two words are to be corrected or not. When both $i \leq 31$ and $j \leq 31$ are satisfied, the two words are corrected and thereafter pointers are added to all words. When $i \leq 31$ and $j \leq 31$ are not satisfied, all the words are given pointers.

(D) In the case of more than three word errors, no correcting operation is carried out and pointers are added to all words.

As mentioned above, the error correction at the first stage is carried out and the data having been subjected to the first error correction and obtained at the output end of the first decoder 9B, which contain the twenty-four audio signal data words $S_1'$ to $S_{24}'$ and the four first error correcting words $P_1'$ to $P_4'$, are applied to the de-interleaver 9C. Then, at the output end of the de-interleaver 9C, the de-interleaved data containing the twenty-four audio signal data words $S_1''$ to $S_{24}''$ and the four first error correcting words $P_1''$ to $P_4''$ are derived to be applied to the second decoder 9D. In the second decoder 9D, the following operations are performed:

(a) In the case of no error, the pointers added by the first decoder 9B are cleared. If there is no pointer, the data are unchanged.

(b) In the case of one word error, the error location i is detected in order to judge whether the one word is to be corrected or not. If $i \leq 27$ is satisfied, the one word is corrected and thereafter the pointer added by the first decoder 9B is cleared. However, if $i \leq 27$ is not satisfied, no correcting operation is carried out and any pointer added previously is left unchanged, that is, the pointer is copied.

(c) In the case of two word errors, the error locations i and j are detected in order to judge whether the two words are to be corrected or not. When both $i \leq 27$ and $j \leq 27$ are satisfied, the number $N_p$ of the pointers added in the first decoder 9B is detected. In this case, it is checked whether $N_p \leq 4$ is satisfied or not. When $N_p \leq 4$ is satisfied, the following operation steps are taken in connection with the pointers added in the first decoder 9B:

(c-1) In case that the locations of the words having the pointers added in the first decoder 9B coincide with neither i nor j, it is checked whether $N_p > 2$ is satisfied or not. If $N_p > 2$ is satisfied, the pointers added in the first decoder 9B are left unchanged and then the data are subjected to the next process. If $N_p > 2$ is not satisfied, pointers are added to all words and then the data are subjected to the next process.

(c-2) In case that the locations of the words having the pointer added in the first decoder 9B coincide with both i and j, the two words are corrected, the pointers added to the corrected words are cleared and then the data are subjected to the next process.

(c-3) In case that one of the locations of the words having the pointers added in the first decoder 9B coincides with either i or j, it is checked whether $N_p > 3$ is satisfied or not. If $N_p > 3$ is satisfied, the pointers added in the first decoder 9B are left unchanged and then the data are subjected to the next process. If $N_p > 3$ is not satisfied, pointers are added to all words and then the data are subjected to the next process.

When the $N_p \leq 4$ is not satisfied, the pointers added in the first decoder 9B are left unchanged and the data are subjected to the next process.

Further, when $i \leq 27$ and $j \leq 27$ are not satisfied, the same operation as the operation (d) mentioned hereinafter is carried out.

(d) In the case of more than three word errors, it is checked whether $N_p > 2$ is satisfied or not. If $N_p > 2$ is satisfied, the pointers added in the first decoder 9B are left unchanged. If $N_p>2$ is not satisfied, pointers are added to all words.

The error correction at the second stage is carried out as aforesaid and, as a result of this, the data having been subjected to the second error correction and containing the twenty-four audio signal data words $T_1$ to $T_{24}$ are obtained at the output end of the second decoder 9D. These data are applied to the interpolating circuit 10 in which the correction by interpolation is provided for the words having the pointers added previously.

With such an error correcting mode as described above, in the normal reproducing state, the effective and powerful error correction is performed by the error correcting circuit arrangement which is controlled to exhibit its error correcting ability at the maximum.

Next, the error correction performed in the cue reproducing state or review reproducing state will be explained.

In the cue reproducing state or review reproducing state, the controller 4 produces the control signal for the second controller 9F in response to the manipulation of the key 5 or 6 and consequently the second controller 9F controls the first and second decoders 9B and 9D to reduce thier error correcting ability compared with the error correcting ability exhibited in the normal reproducing state, and the error correcting operation having its flow partially shown by broken lines in FIG. 2 is carried out.

First, the following operations are performed in the first decoder 9B:

(P) In the case of no error, no pointer is added and the data are unchanged.

(Q) In the case of one word error, the error location i is detected in order to judge whether the one word is to be corrected or not. It is checked whether $i \leq 31$ is satisfied or not. If $i \leq 31$ is satisfied, the one word is corrected. On the contrary, if $i \leq 31$ is not satisfied, no correcting operation is carried out and pointers are added to all words.

(R) In the case of more than two word errors, no correcting operation is performed and pointers are added to all words.

The error correction at the first stage is carried out as aforesaid and the data having been subjected to the first error correction and obtained at the output end of the first decoder 9B which contain the twenty-four audio signal data words $S_1'$ to $S_{24}'$ and the four first error correcting words $P_1'$ to $P_4'$, are applied to the de-interleaver 9C. At the output end of the de-interleaver 9C, the de-interleaved data containing the twenty-four audio signal data words $S_1''$ to $S_{24}''$ and the four first error correcting words $P_1''$ to $P_4''$ are derived to be applied to the second decoder 9D. Then, in the second decoder 9D, the following operation are performed:

(p) In the case of no error, the pointers added in the first decoder 9B are cleared. If there is no pointer, the data are unchanged.

(q) In the case of one word error, the error location i is detected in order to judge whether the one word is to be corrected or not. If $i \leq 27$ is satisfied, the one word is corrected and thereafter the pointer added in the first decoder 9B is cleared. However, if $i \leq 27$ is not satisfied, no correcting operation is carried out and any pointer added in the first decoder 9B is left unchanged.

(r) In the case of more than two word errors, pointers are added to all words.

The error correction at the second stage is carried out as aforesaid and the data having been subjected to the second error correction and containing the twenty-four audio signal data words $T_1$ to $T_{24}$ are obtained at the output end of the second decoder 9D. Then, these data from the second decoder 9D are applied to the interpolating circuit 10 in which the correction by interpolation is provided for the words having the pointers added previously.

As aforementioned, in the cue reproducing state or review reproducing state, the error correction is performed in the mode different from the error correcting mode in the normal reproducing state. In the error correcting mode taken in the cue reproducing state or review reproducing state, the error correcting circuit arrangement is controlled to exhibit such error correcting ability as to able to perform the error correction in the case of one word error but to be unable to perform the error correction in the case of more than two word errors. This means that the error correcting ability of the error correcting circuit arrangement in the cue reproducing state or review reproducing stats is reduced in comparison with the error correcting ability exhibited in the normal reproducing state.

The abovementioned error correction is carried out for each frame unit containing thirty-two words in the reproduced digital data, and for the purpose of avoiding erroneous error correction, when a word error is detected from the thirty-two words contained in one frame unit, it is checked whether the error location exists in the one frame unit or not in order to judge whether the detected erroneous word is to be corrected or not. Then, in case that the detected erroneous word is judged to be corrected, the error correcting operation is performed and, in the other case, the error correcting operation is not performed but the pointer is added to the detected erroneous word to indicate that the associated word is doubtful. However, although in case that only one word error is detected from the data of one frame unit it is highly probable that the detected erroneous word is to be corrected, in case that more than two word errors are detected from the data of one frame unit, it is increased the probability that the detected erroneous words contain such a word as to cause erroneous error correction when it is subjected to the error correction. Accordingly, in case that the error correcting circuit arrangement has such advanced error correcting ability as to be able to perform the error correction in the case of more that two word errors, the possibility that the erroneous error correction is caused is increased. That is, as for avoidance of the erroneous error correction, it is preferable that the error correcting circuit arrangement has such reduced error correcting ability as to be able to perform the error correction only in the case of one word error.

Accordingly, in the embodiment aforesaid, when the cue reproducing state or review reproducing state wherein the reproduced digital data applied to the error correcting circuit arrangement contain lacked portions therein and therefore erroneous error correction is caused easily is taken, the error correcting ability of the error correcting circuit arrangement is reduced with the intention of avoiding the erroneous error correction and the correction by interpolation is more burdened.

As described above, in the disc player according to the present invention, the error correcting circuit arrangement, which is formed in, for example, the decoding circuit block 9 in the aforesaid embodiment, takes the first error correcting mode wherein the error correction is carried out for both of one word error and two word errors when the disc player is in the normal reproducing state and the second error correcting mode wherein the error correction is carried out for only one word error when the disc player is in the cue reproducing state or review reproducing state. Consequently, the reliable and powerful error correction is performed in the normal reproducing state and such error correction that it would rather aim at avoiding erroneous error correction is performed in the cue reproducing state or review reproducing state so as to prevent click noise components from being contained in the reproduced audio signal.

What is claimed is:

1. A disc player for reproducing an information signal from a disc having an information track on which the information signal is recorded in the form of digital data, comprising;

detecting circuit means for being supplied with a signal read out from the disc by a pickup device which is provided for reading the signal recorded on the disc and producing a reproduced digital data, error correcting circuit means for correcting errors contained in the reproduced digital data from said detecting circuit means, said error correcting circuit means being operative to take either a first error correcting mode wherein the error correcting ability thereof is exhibited at the maximum or a second error correcting mode wherein the error correcting ability thereof is reduced in comparison with the error correcting ability exhibited in the first error correcting mode selectively, and control circuit means for controlling said error correcting circuit means to perform the error correcting operation in said first error correcting mode when the normal reproducing state is taken and in said second error correcting mode when the reproducing state by fast forwarding operation or fast reversing operation is taken.

2. A disc player according to claim 1, wherein said error correcting circuit means comprises a multiplexer for deriving information data words, first error correcting words and second error correcting words contained in each one unit in the reproduced digital data, a first decoder for carrying out a first error correction for the information data words and the first error correcting words derived from said multiplexer by using the second error correcting words also derived from said multiplexer and a second decoder for carrying out a second error corection for the information data words having been subjected to the first error correction at said first decoder by using the first error correcting words also having been subjected to the first error correction at said first decoder.

3. A disc player according to claim 2, wherein said error correcting circuit means further comprises a de-interleaver provided between said first decoder and said second decoder for de-interleaving the information words and first error correcting words having been subjected to the first error correction at the first decoder.

4. A disc player according to claim 2, wherein said control circuit means controls both said first and second decoders so as to alter thier operating manner.

* * * * *